United States Patent
Lin et al.

(10) Patent No.: US 10,998,024 B2
(45) Date of Patent: May 4, 2021

(54) METHOD FOR ENHANCING TUNNEL MAGNETORESISTANCE IN MEMORY DEVICE

(71) Applicant: Taiwan Semiconductor Manufacturing Co., Ltd., Hsinchu (TW)

(72) Inventors: Wen-Chin Lin, Hsinchu (TW); Hung-Chang Yu, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/805,839

(22) Filed: Mar. 2, 2020

(65) Prior Publication Data
US 2021/0035621 A1    Feb. 4, 2021

Related U.S. Application Data

(60) Provisional application No. 62/880,660, filed on Jul. 31, 2019.

(51) Int. Cl.
*G11C 11/16*    (2006.01)
(52) U.S. Cl.
CPC ...... *G11C 11/1675* (2013.01); *G11C 11/1655* (2013.01); *G11C 11/1657* (2013.01); *G11C 11/1659* (2013.01); *G11C 11/1673* (2013.01)

(58) Field of Classification Search
None
See application file for complete search history.

(56) References Cited

U.S. PATENT DOCUMENTS

| | | | |
|---|---|---|---|
| 9,812,499 B1* | 11/2017 | Satoh | H01L 27/24 |
| 2004/0113137 A1* | 6/2004 | Lowrey | H01L 27/2427 257/5 |
| 2004/0114413 A1* | 6/2004 | Parkinson | H01L 27/2481 365/100 |
| 2010/0315870 A1* | 12/2010 | Abedifard | G11C 11/5607 365/171 |
| 2015/0255717 A1* | 9/2015 | Park | G11C 13/0011 438/382 |
| 2018/0075904 A1* | 3/2018 | Ge | H01L 45/085 |
| 2020/0135252 A1* | 4/2020 | Gupta | G11C 11/161 |
| 2020/0235162 A1* | 7/2020 | Majhi | H01L 27/2409 |

* cited by examiner

*Primary Examiner* — J. H. Hur
(74) *Attorney, Agent, or Firm* — JCIPRNET (57) ABSTRACT

A method to control a memory cell in a memory device, where the memory cell includes a switch, a memory element and a negative resistance device coupled in series, the method includes: determine whether the memory cell is in a read operation or not; during the read operation in the memory cell, apply a read voltage greater than a predetermined threshold voltage of the negative resistance device for making the negative resistance device entering into a negative resistance state. A memory device that includes a memory cell array is also provided.

20 Claims, 6 Drawing Sheets

METHOD FOR ENHANCING TUNNEL MAGNETORESISTANCE IN MEMORY DEVICE

CROSS-REFERENCE TO RELATED APPLICATION

This application claims the priority benefit of U.S. provisional application Ser. No. 62/880,660, filed on Jul. 31, 2019. The entirety of the above-mentioned patent application is hereby incorporated by reference herein and made a part of this specification.

BACKGROUND

The disclosure relates to a memory device and, more particularly, to a magnetic RAM (MRAM) device. During a read operation in the MRAM device, a magnetic tunnel junction (MTJ) device is coupled in series with a resistive load, results in increasing a loading current in the MRAM device. The effect of increasing the loading current decreases an effective tunnel magnetoresistance (TMR) of the MRAM device.

Therefore, there is a need to design the MRAM device with enhancing the effective TMR during the read operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
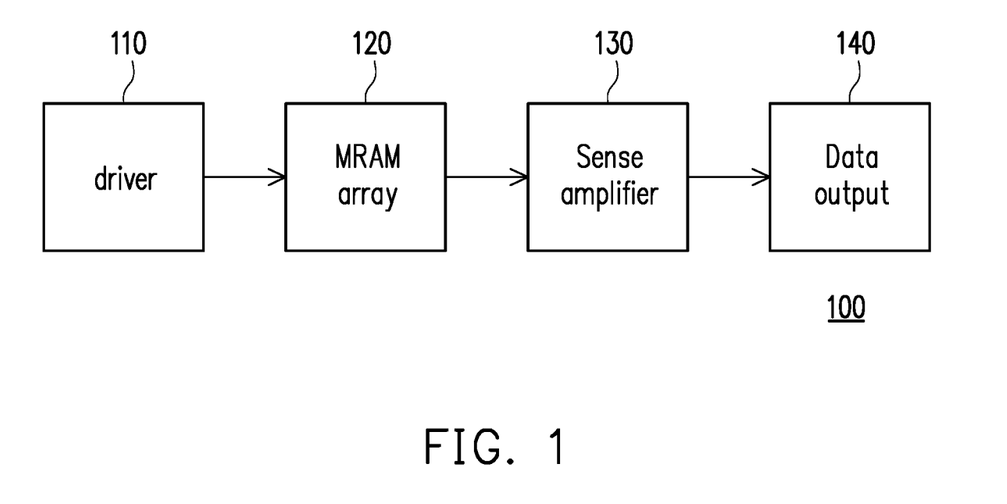
FIG. 1 illustrates a block diagram of a memory device according to an exemplary embodiment of the disclosure.

FIG. 1 illustrates a block diagram of a memory device according to an exemplary embodiment of the disclosure. The memory device 100 includes a driver 110, a memory cell array 120, a sense amplifier 130, and a data output 140.

The memory device 100 is a non-volatile memory. In particular, the memory device 100 is a magnetic RAM (MRAM) device. The memory device 100 may be a PCRAM, a ReRAM, and a RRAM device, thus the type of memory device 100 in the disclosure is not limited thereto.

The memory device 100 includes a memory cell array 120, typically 8 to 64 memory cells in the memory cell array 120. Typically, a size of memory cell array 120 may be 16×8 Kb, 64×8 Kb, 512×8 Kb, but the size of memory cell array 120 in this disclosure is not limited thereto.

In detail, the memory cell array 120 includes a plurality of memory cells (not shown). Each of the plurality of memory cells includes a plurality of the word lines, a plurality of a bit lines, a plurality of common source lines.

The driver 110 is configured to generate a read voltage and a write voltage to perform a read operation and a write operation in the memory device 110.

The sense amplifier 130 is configured to perform a data access operation in the memory cell array 110. The data access operation includes the read operation, the write operation, and a backup operation, and so on. Thus, the data access operation in this disclosure is not limited herein.

The data output 140 is configured to receive an input from the sense amplifier 130 and generates an output.

Figure 2A:
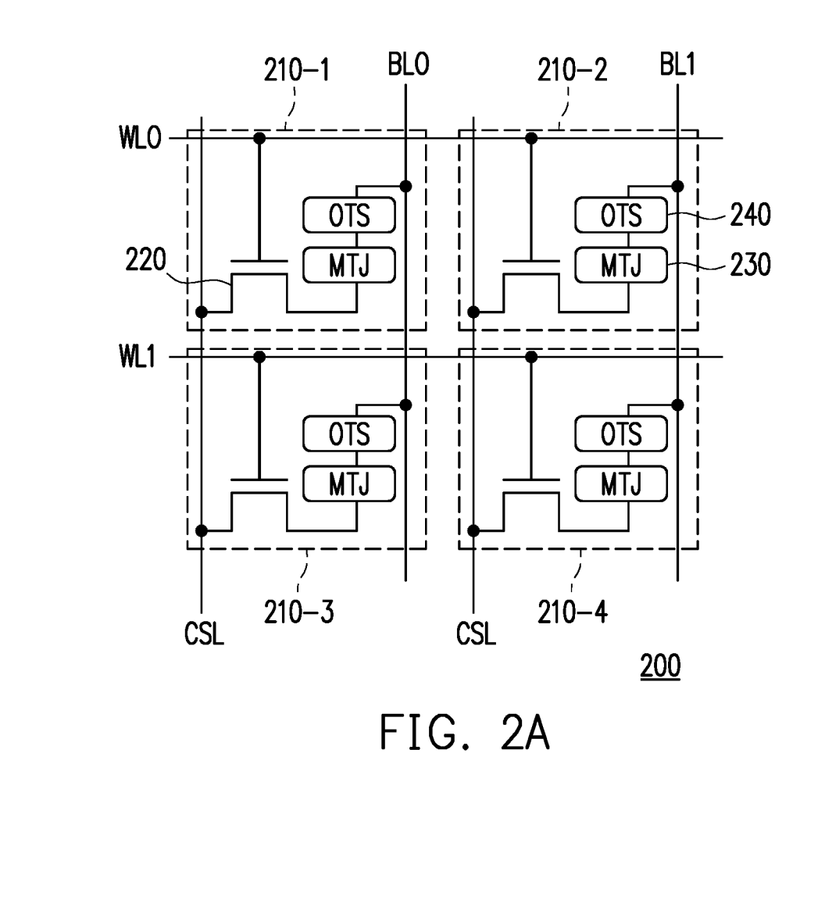
FIG. 2A illustrates a schematic diagram of a memory cell array according to an exemplary embodiment of the disclosure.

FIG. 2A illustrates a schematic diagram of a memory cell array according to an exemplary embodiment of the disclosure. The memory cell array 200 is 2×2 array. Same elements in FIG. 2A have a same reference numbers as the memory device 100 shown in FIG. 1.

In some embodiments, the memory cell array 200 may be 4×4, 8×8, 16×16 and so on. Thus, the size of the memory cell array 200 is not limited herein.

The memory cell array 200 includes a plurality of memory cells 210-1, 210-2, 210-3, 210-4, a plurality of word lines WL0, WL1, a plurality of bit lines BL0, BL1, and a plurality of common source lines CSL.

Each of the memory cells 210-1, 210-2, 210-3, 210-4 includes a switch 220, a memory element 230, and a negative resistance device 240.

The switch 220 is a CMOS transistor.

In this embodiment, the switch 220 is a NMOS transistor includes a source terminal, a drain terminal, and a control terminal. The drain terminal is coupled to the memory element 230. The source terminal is coupled to the common source lines CSL and the control terminal is coupled to the corresponding word lines WL0, WL1.

The memory element 230 is a magnetic tunnel junction (MTJ) device. The memory element 230 includes a first terminal and a second terminal. The first terminal of the memory element 230 is coupled to the drain terminal of the switch 220. The second terminal of the memory element 230 is coupled to the negative resistance device 240. The memory element 230 includes two resistance states (R_high, R_low) to represent a digital data in the memory device. The difference between the two resistance states are normalized by R_low is also defined as an intrinsic TMR.

The negative resistance device 240 is an Ovonic threshold switch (OTS). The negative resistance device 240 includes a first terminal and a second terminal. The first terminal of the negative resistance device 240 is coupled to the second terminal of the memory element 230. The second terminal of the negative resistance device 240 is coupled to the corresponding bit lines BL0, BL1.

It is noted that the switch 220, the memory element 230, and the negative resistance device 240 are connected in series. During the memory cell array 200 operates in a read operation, the read voltage is applied to the negative resistance device 240 by a voltage difference between the corresponding bit lines BL0, BL1 and the corresponding common source lines CSL. After that, a read voltage greater than a predetermined threshold voltage of the negative resistance device 240 is applied to the negative resistive device 240 for making the negative resistance device 240 entering into a negative resistance state. After the negative resistance device 240 entering into the negative resistance state, a loading of each of the memory cells are reduced.

During the write operation in the memory cell array 200, a write voltage greater than the predetermined threshold voltage is applied to the negative resistance device 240 for making the negative resistance device 240 entering into a low resistance state.

The predetermined threshold voltage of the negative resistive device 240 is adjusted with different materials.

In some embodiments, the negative resistance device 240 is a metal-semiconductor-metal (MSM).

In some embodiments, the negative resistance device 240 is a mixed-ionic-electronic-conduction device (MIEC).

In some embodiments, the negative resistance device 240 includes at least one of the elements in a chalcogenide group. For example, the elements may be different combinations of Arsenic As, Germanium Ge, Silicon Si, Sulfur S, Selenium Se, Tellurium Te, and Nitrogen N, thus the type of element used as the negative resistance device 240 is not limited thereto.

Based on the structure, by adding a negative resistance device 240 in series with the memory element 230, the negative resistance device 240 enters into the negative resistance state during the read operation, thus reducing the loading of the memory element 230. Therefore, an effective TMR is enhanced in the memory device.

Figure 2B:
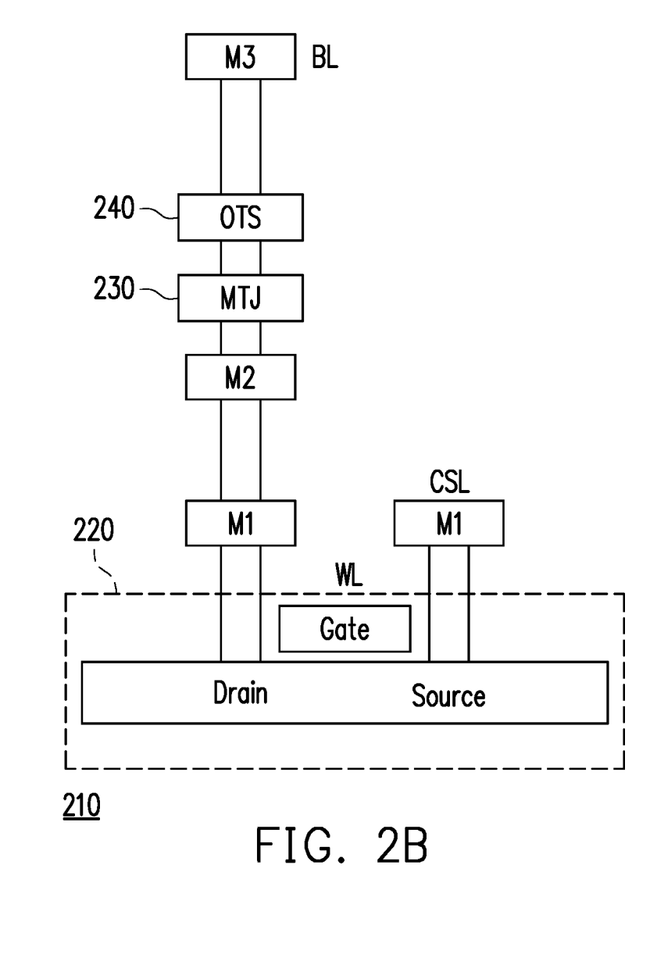
FIG. 2B illustrates a layout of a memory cell array according to an exemplary embodiment of the disclosure.

FIG. 2B illustrates a layout of a memory cell according to an exemplary embodiment of the disclosure. Same elements in FIG. 2B have a same reference numbers as the memory cell array 200 shown in FIG. 2A.

The memory cell 210 includes a switch 220, a memory element 230, and a negative resistance device 240.

The switch 220 is a CMOS transistor.

In this embodiment, the switch 220 is a NMOS transistor includes a source terminal, a drain terminal, and a control terminal. The drain terminal is coupled to the memory element 230 through a metal M1. The source terminal is coupled to the common source lines CSL through the metal M1 and the control terminal is coupled to a word line WL.

The memory element 230 is a magnetic tunnel junction (MTJ) device. The memory element 230 includes a first terminal and a second terminal. The first terminal of the memory element 230 is coupled to the drain terminal of the switch 220 through metal M2. The second terminal of the memory element 230 is coupled to the negative resistance device 240.

The negative resistance device 240 is an Ovonic threshold switch (OTS). The negative resistance device 240 includes a first terminal and a second terminal. The first terminal of the negative resistance device 240 is coupled to the second terminal of the memory element 230 through a metal M2. The second terminal of the negative resistance device 240 is coupled to a bit line BL through a metal M2.

It is noted that the metal M1, the metal M2 and the metal M3 are connecting metals that do not electrically connect each other.

With reference to FIG. 2A, during the memory cell array 200 operates in a read operation, the read voltage is applied to the negative resistance device 240 by a voltage difference between the corresponding bit lines BL0, BL1 and the corresponding common source lines CSL. After that, a read voltage greater than a predetermined threshold voltage of the negative resistance device 240 is applied to the negative resistive device 240 for making the negative resistance device 240 entering into a negative resistance state. After the negative resistance device 240 entering into the negative resistance state, a loading of each of the memory cells are reduced.

During the write operation in the memory cell array 200, a write voltage greater than the predetermined threshold voltage is applied to the negative resistance device 240 for making the negative resistance device 240 entering into the low resistance state.

Figure 3A:
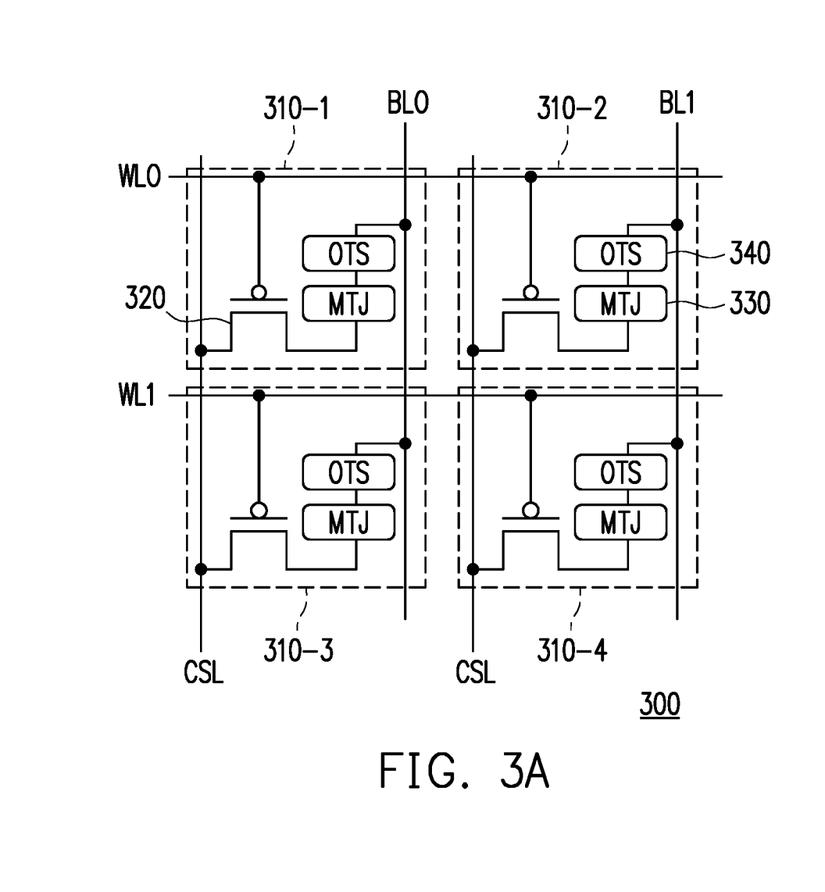
FIG. 3A illustrates a schematic diagram of a memory cell array according to an exemplary embodiment of the disclosure.

FIG. 3A illustrates a schematic diagram of a memory cell array according to an exemplary embodiment of the disclosure. The memory cell array 200 is 2×2 array.

In some embodiments, the memory cell array 300 may be 4×4, 8×8, 16×16 and so on. Thus, the size of the memory cell array 300 is not limited herein.

The memory cell array 300 includes a plurality of memory cells 310-1, 310-2, 310-3, 310-4, a plurality of word lines WL0, WL1, a plurality of bit lines BL0, BL1, and a plurality of common source lines CSL.

Each of the memory cells 310-1, 310-2, 310-3, 310-4 includes a switch 320, a memory element 330, and a negative resistance device 340.

The switch 320 is a CMOS transistor.

In this embodiment, the switch 320 is a PMOS transistor includes a source terminal, a drain terminal, and a control terminal. The source terminal is coupled to the memory element 330. The drain terminal is coupled to the common source lines CSL and the control terminal is coupled to the corresponding word lines WL0, WL1.

The memory element 330 is a magnetic tunnel junction (MTJ) device. The memory element 330 includes a first terminal and a second terminal. The first terminal of the memory element 330 is coupled to the source terminal of the switch 320. The second terminal of the memory element 330 is coupled to the negative resistance device 340.

The negative resistance device 340 is an Ovonic threshold switch (OTS). The negative resistance device 340 includes a first terminal and a second terminal. The first terminal of the negative resistance device 340 is coupled to the second terminal of the memory element 330. The second terminal of the negative resistance device 340 is coupled to the corresponding bit lines BL0, BL1.

It is noted that the switch 320, the memory element 330, and the negative resistance device 340 are connected in series. During the memory cell array 300 operates in a read operation, the read voltage is applied to the negative resistance device 340 by a voltage difference between the corresponding bit lines BL0, BL1 and the corresponding common source lines CSL. After that, a read voltage greater than a predetermined threshold voltage of the negative resistance device 340 is applied to the negative resistive device 340 for making the negative resistance device 340 entering into a negative resistance state. After the negative resistance device 340 entering into the negative resistance state, a loading of each of the memory cells are reduced.

During the write operation in the memory cell array 300, a write voltage greater than the predetermined threshold voltage is applied to the negative resistance device 340 for making the negative resistance device entering into a low resistance state.

The predetermined threshold voltage of the negative resistive device 340 is adjusted with different materials.

In some embodiments, the negative resistance device 340 is a metal-semiconductor-metal (MSM).

In some embodiments, the negative resistance device 340 is a mixed-ionic-electronic-conduction device (MIEC).

In some embodiments, the negative resistance device 340 includes at least one of the elements in a chalcogenide group. For example, the elements may be different combinations of Arsenic As, Germanium Ge, Silicon Si, Sulfur S, Selenium Se, Tellurium Te, and Nitrogen N, thus the type of element used as the negative resistance device 340 is not limited thereto.

Based on the structure, by adding a negative resistance device 340 in series with the memory element 330, the negative resistance device 340 enters into the negative resistance state during the read operation thus reducing the loading of the memory element 330. Therefore, an effective TMR is enhanced in the memory device.

Figure 3B:
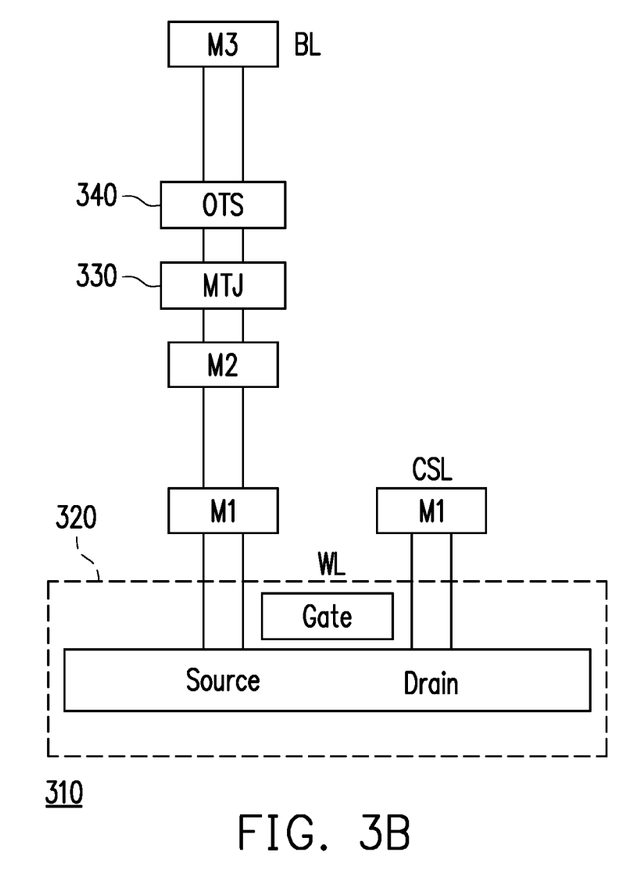
FIG. 3B illustrates a layout of a memory cell array according to an exemplary embodiment of the disclosure.

FIG. 3B illustrates a layout of a memory cell according to an exemplary embodiment of the disclosure. Same elements in FIG. 3B have a same reference numbers as the memory cell array 300 shown in FIG. 3A.

The memory cell 310 includes a switch 320, a memory element 330, and a negative resistance device 340.

The switch 320 is a CMOS transistor.

In this embodiment, the switch 320 is a NMOS transistor includes a source terminal, a drain terminal, and a control terminal. The source terminal is coupled to the memory element 330 through a metal M1. The drain terminal is coupled to the common source lines CSL through the metal M1 and the control terminal is coupled to a word line WL.

The memory element 330 is a magnetic tunnel junction (MTJ) device. The memory element 330 includes a first terminal and a second terminal. The first terminal of the memory element 330 is coupled to the source terminal of the switch 320 through metal M2. The second terminal of the memory element 330 is coupled to the negative resistance device 340.

The negative resistance device 340 is an Ovonic threshold switch (OTS). The negative resistance device 340 includes a first terminal and a second terminal. The first terminal of the negative resistance device 340 is coupled to the second terminal of the memory element 330 through a metal M2. The second terminal of the negative resistance device 340 is coupled to a bit line BL through a metal M2.

It is noted that the metal M1, the metal M2 and the metal M3 are connecting metals that do not electrically connect each other.

With reference to FIG. 3A, during the memory cell array 300 operates in a read operation, the read voltage is applied to the negative resistance device 340 by a voltage difference between the corresponding bit lines BL0, BL1 and the corresponding common source lines CSL. After that, a read voltage greater than a predetermined threshold voltage of the negative resistance device 340 is applied to the negative resistive device 340 for making the negative resistance device 340 entering into a negative resistance state. After the negative resistance device 340 entering into the negative resistance state, a loading of each of the memory cells are reduced.

During the write operation in the memory cell array 300, a write voltage greater than the predetermined threshold voltage is applied to the negative resistance device 340 for making the negative resistance device 340 entering into the low resistance state.

Figure 4A:
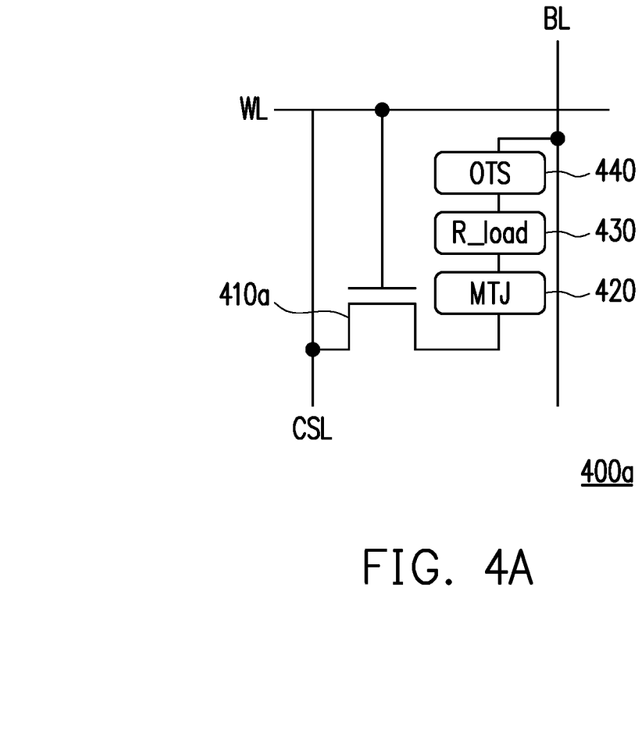
FIG. 4A illustrates a loading of a memory cell according to an exemplary embodiment of the disclosure.

FIG. 4A illustrating a loading of a memory cell according to an exemplary embodiment of the disclosure. The memory cell 400a includes a switch 410a, a memory element 420, a resistive load 430, and a negative resistance device 450. Same elements in FIG. 4A have a same reference numbers as the memory cell array 200 shown in FIG. 2A.

The switch 410 is a CMOS transistor.

In this embodiment, the switch 410a is a NMOS transistor includes a source terminal, a drain terminal, and a control terminal. The drain terminal is coupled to the memory element 420. The source terminal is coupled to the common source lines CSL and the control terminal is coupled to a corresponding word line WL.

The memory element 420 is a magnetic tunnel junction (MTJ) device. The memory element 420 includes a first terminal and a second terminal. The first terminal of the memory element 420 is coupled to the drain terminal of the switch 410a through metal M2. The second terminal of the memory element 420 is coupled to the resistive load 430.

The resistive load 430 includes a first terminal and a second terminal. The first terminal of the resistive load 430 is coupled to the memory element 420 and the second terminal of the resistive load 430 is coupled to the negative resistance device 440.

The negative resistance device 440 is an Ovonic threshold switch (OTS). The negative resistance device 440 includes a first terminal and a second terminal. The first terminal of the negative resistance device 440 is coupled to the second terminal of the resistive load 430. The second terminal of the negative resistance device 440 is coupled to a corresponding bit line BL. It is noted that the switch 410, the memory element 420, the resistive load 430 and the negative resistance device 440 are connected in series.

Figure 4B:
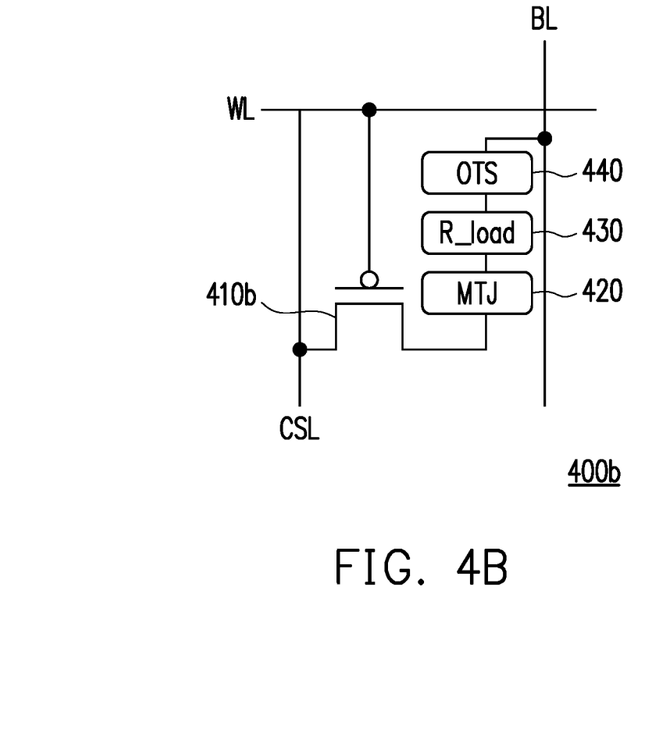
FIG. 4B illustrates a loading of a memory cell according to an exemplary embodiment of the disclosure.

FIG. 4B illustrating a loading of a memory cell according to an exemplary embodiment of the disclosure. The memory cell 400b includes a switch 410b, a memory element 420, a resistive load 430, and a negative resistance device 450. Same elements in FIG. 4B have a same reference numbers as the memory cell array 300 shown in FIG. 3A.

The switch 410 is a CMOS transistor.

In this embodiment, the switch 410b is a PMOS transistor includes a source terminal, a drain terminal, and a control terminal. The source terminal is coupled to the memory element 420. The drain terminal is coupled to the common source lines CSL and the control terminal is coupled to a corresponding word line WL.

The memory element 420 is a magnetic tunnel junction (MTJ) device. The memory element 420 includes a first terminal and a second terminal. The first terminal of the memory element 420 is coupled to the source terminal of the switch 410b through metal M2. The second terminal of the memory element 420 is coupled to the resistive load 430.

The resistive load 430 includes a first terminal and a second terminal. The first terminal of the resistive load 430 is coupled to the memory element 420 and the second terminal of the resistive load 430 is coupled to the negative resistance device 440.

The negative resistance device 440 is an Ovonic threshold switch (OTS). The negative resistance device 440 includes a first terminal and a second terminal. The first terminal of the negative resistance device 440 is coupled to the second terminal of the resistive load 430. The second terminal of the negative resistance device 440 is coupled to a corresponding bit line BL. It is noted that the switch 410a, the memory element 420, the resistive load 430 and the negative resistance device 440 are connected in series.

Figure 4C:
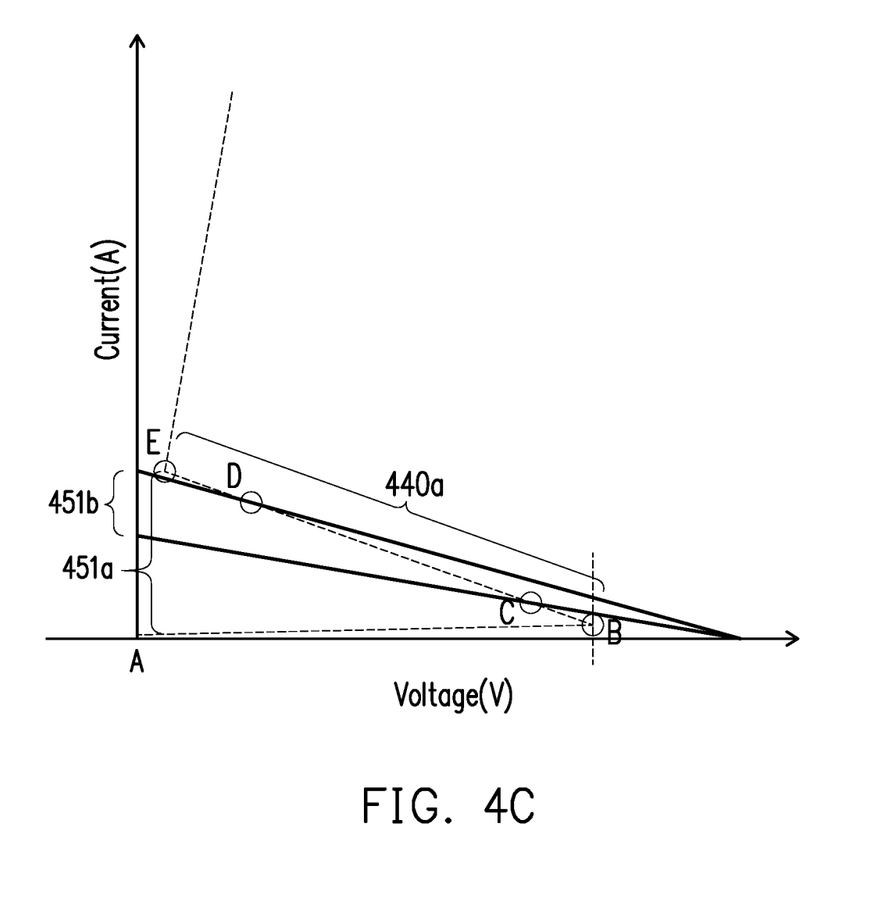
FIG. 4C illustrating I-V curve of the memory device during read operation in accordance with some embodiments.

FIG. 4C illustrating I-V curve of the memory device during read operation in accordance with some embodiments. With reference to FIG. 1, FIG. 4A, and FIG. 4B, during the memory device 100 operates in a read operation, a read voltage greater than a predetermined threshold voltage of the negative resistance device 440 is applied to the negative resistive device 440 for making the negative resistance device 440 entering into a negative resistance state 440a.

In this embodiment, an operation range of the negative resistance device 440 is between 0 to 0.2V. With reference to a table I, at point A, the voltage and the current of the negative resistance device 440 is 0. At point B, the when the voltage is 0.15V, which is a threshold voltage (Vth) of the negative resistance device 440, the current is 2.2 uA. At point C, when the voltage of the negative resistance device 440 is 0.139 and the current is 3.6 uA. Similarly, at point D, when the voltage of the negative resistance device 440 is 0.045 and the current is 15.5 uA and at point E, when the voltage of the negative resistance device 440 is 0.01 and the current is 19.9 uA.

TABLE I

| Point | Voltage (V) | Current (A) |
|-------|-------------|-------------|
| A | 0 | 0 |
| B | 0.15(Vth) | 2.2 |
| C | 0.139 | 3.6 |
| D | 0.045 | 15.5 |
| E | 0.01 | 19.9 |

In detail, when the read voltage which is greater than the voltage at point B is applied with the current greater than or equal to 25 uA, the negative resistance device 440 enters into the negative resistance state. The read current corresponds to different operating states in the negative resistance device 440 from point B to point E. The signal to noise ratio (SNR) of the memory device 100 is enhanced in the ratio of SNR=ΔR/R. It is noted that a low resistance value of the negative resistance device 440 is 15.5 A at point D and a high resistance value of the negative resistance device 440 is 3.6 uA, thus the TMR of the memory device 451a is effectively enhanced compared with the conventional TMR of the memory device 451b. The I-V curve of the memory cell 400a, 400b is the sum of a memory element resistance R_MTJ, a resistive load R_load, and a negative resistance R_OTS.

With reference to FIG. 1, FIG. 4A, and FIG. 4B, during a write operation in the memory device 100, a write voltage greater than the predetermined threshold voltage is applied to the negative resistance device 440 for making the negative resistance device 440 entering into the low resistance state 440a.

In detail, when the write voltage is greater than point B, the negative resistance device 440 enters into the low resistance state. It is noted that the negative resistance device 440 is a series resistance less than 500 ohm in a write current path.

Based on the above, by adding the negative resistance device 440 in series with the memory element 430, the negative resistance device 440 enters into the negative resistance state 440a during the read operation, thus reducing the loading of the memory element 430. Therefore, an effective TMR is enhanced in the memory device. In addition, during the write operation, the negative resistance device 440 operates into the negative resistance state 440a and the resistance of the negative resistance device 440 is less than 500 ohm in the write current path.

Figure 5:
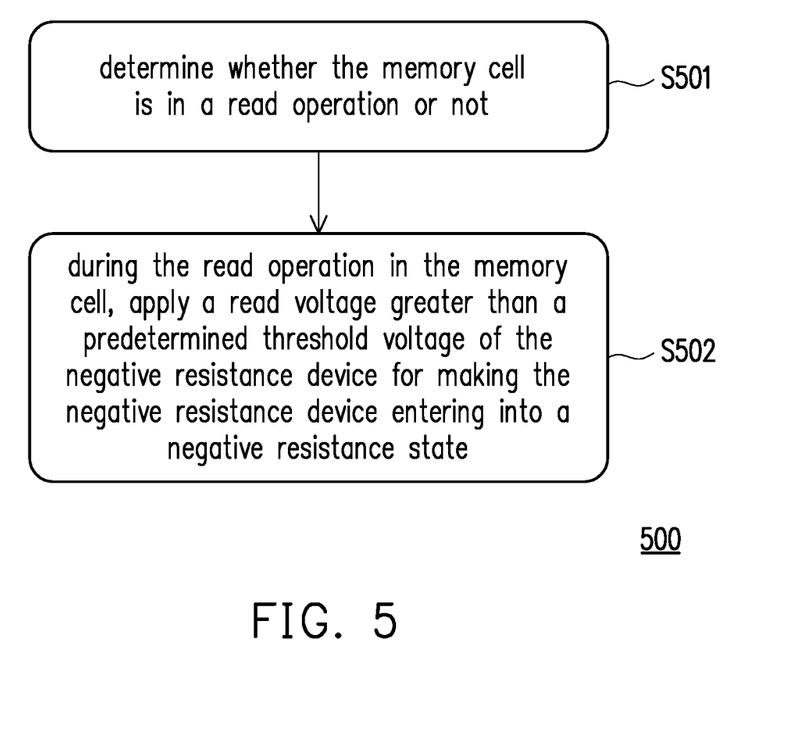
FIG. 5 illustrates a flowchart of a method to control a memory cell in a memory device according to an exemplary embodiment of the disclosure.

FIG. 5 illustrates a flowchart of a method to control a memory cell in a memory device according to an exemplary embodiment of the disclosure. The memory cell includes a switch, a memory element and a negative resistance device and are coupled in series. The method 500 includes determine whether the memory cell is in a read operation or not in step S501. In step S502, during the read operation in the memory cell, apply a read voltage greater than a predetermined threshold voltage of the negative resistance device for making the negative resistance device entering into a negative resistance state.

According to some embodiments of the disclosure by referring to FIG. 1, FIG. 2A, and FIG. 5, a method to control a memory cell in a memory device and a memory device. The memory device 100 includes a driver 110, a memory cell array 120, a sense amplifier 130, and a data output 140. The memory device 100 includes a memory cell array 120. The memory cell array 120 includes a plurality of memory cells. Each of the plurality of memory cells includes a plurality of the word lines, a plurality of a bit lines, a plurality of common source lines. The driver 110 is configured to generate a read voltage and a write voltage to perform a read operation and a write operation in the memory device 110. The sense amplifier 130 is configured to perform a data access operation in the memory cell array 110. The data access operation includes a read operation, a write operation, and a backup operation, and so on. The data output 140 is configured to receive an input from the sense amplifier and generates an output. The memory cell array 200 includes a plurality of memory cells 210-1, 210-2, 210-3, 210-3, a plurality of word lines WL0, WL1, a plurality of bit lines BL0, BL1, a plurality of common source lines CSL. Each of the memory cells 210-1, 210-2, 210-3, 210-3 includes a switch 220, a memory element 230, and a negative resistance device 240. The switch 220 is a NMOS transistor that includes a source terminal, a drain terminal, and a control terminal. The drain terminal is coupled to the memory element 230. The source terminal is coupled to the common source lines CSL and the control terminal is coupled to the corresponding word lines WL0, WL1. The memory element 230 is a magnetic tunnel junction (MTJ) device. The memory element 230 includes a first terminal and a second terminal. The first terminal of the memory element 230 is coupled to the drain terminal of the switch 220. The second terminal of the memory element 230 is coupled to the negative resistance device 240. The negative resistance device 240 is an Ovonic threshold switch (OTS). The negative resistance device 240 includes a first terminal and a second terminal. The first terminal of the negative resistance device 240 is coupled to the second terminal of the memory element 230. The second terminal of the negative resistance device 240 is coupled to the corresponding bit lines BL0, BL1. The switch 220, the memory element 230, and the negative resistance device 240 are connected in series. During the memory cell array 200 operates in a read operation, the read voltage is applied to the negative resistance device 240 by a voltage difference between the corresponding bit lines BL0, BL1 and the corresponding common source lines CSL. After that, a read voltage greater than a predetermined threshold voltage of the negative resistance device 240 is applied to the negative resistive device 240 for making the negative resistance device 240 entering into a negative resistance state. After the negative resistance device 240 entering into the negative resistance state, a loading of each of the memory cells are reduced. During the write operation in the memory cell array 200, a write voltage greater than the predetermined threshold voltage is applied to the negative resistance device 240 for making the negative resistance device 240 entering into a low resistance state. The predetermined threshold voltage of the negative resistive device 240 is adjusted with different materials. In some embodiments, the negative resistance device 240 is a metal-semiconductor-metal (MSM). In some embodiments, the negative resistance device 240 is a mixed-ionic-electronic-conduction device (MIEC). In some embodiments, the negative resistance device 240 includes at least one of the elements in a chalcogenide group. The method 500 includes determine whether the memory cell is in a read operation or not in step S501. In step S502, during the read operation in the memory cell, apply a read voltage greater than a predetermined threshold voltage of the negative resistance device for making the negative resistance device entering into a negative resistance state.

According to some embodiments of the disclosure by referring to FIG. 1, FIG. 3A, and FIG. 5, a method to control a memory cell in a memory device and a memory device. The memory device 100 includes a driver 110, a memory cell array 120, a sense amplifier 130, and a data output 140. The memory device 100 includes a memory cell array 120. The memory cell array 120 includes a plurality of memory cells. Each of the plurality of memory cells includes a plurality of the word lines, a plurality of a bit lines, a plurality of common source lines. The driver 110 is configured to generate a read voltage and a write voltage to perform a read operation and a write operation in the memory device 110. The sense amplifier 130 is configured to perform a data access operation in the memory cell array 110. The data access operation includes a read operation, a write operation, and a backup operation, and so on. The data output 140 is configured to receive an input from the sense amplifier and generates an output. The memory cell array 300 includes a plurality of memory cells 310-1, 310-2, 310-3, 310-3, a plurality of word lines WL0, WL1, a plurality of bit lines BL0, BL1, a plurality of common source lines CSL. Each of the memory cells 310-1, 310-2, 310-3, 310-3 includes a switch 320, a memory element 330, and a negative resistance device 340. The switch 320 is a PMOS transistor that includes a source terminal, a drain terminal, and a control terminal. The source terminal is coupled to the memory element 230. The drain terminal is coupled to the common source lines CSL and the control terminal is coupled to the corresponding word lines WL0, WL1. The memory element 330 is a magnetic tunnel junction (MTJ) device. The memory element 330 includes a first terminal and a second terminal. The first terminal of the memory element 330 is coupled to the source terminal of the switch 320. The second terminal of the memory element 330 is coupled to the negative resistance device 340. The negative resistance device 340 is an Ovonic threshold switch (OTS). The negative resistance device 340 includes a first terminal and a second terminal. The first terminal of the negative resistance device 340 is coupled to the second terminal of the memory element 330. The second terminal of the negative resistance device 340 is coupled to the corresponding bit lines BL0, BL1. The switch 320, the memory element 330, and the negative resistance device 340 are connected in series. During the memory cell array 300 operates in a read operation, the read voltage is applied to the negative resistance device 340 by a voltage difference between the corresponding bit lines BL0, BL1 and the corresponding common source lines CSL. After that, a read voltage greater than a predetermined threshold voltage of the negative resistance device 340 is applied to the negative resistive device 340 for making the negative resistance device 340 entering into a negative resistance state. After the negative resistance device 340 entering into the negative resistance state, a loading of each of the memory cells are reduced. During the write operation in the memory cell array 300, a write voltage greater than the predetermined threshold voltage is applied to the negative resistance device 340 for making the negative resistance device 340 entering into a low resistance state. The predetermined threshold voltage of the negative resistive device 340 is adjusted with different materials. In some embodiments, the negative resistance device 340 is a metal-semiconductor-metal (MSM). In some embodiments, the negative resistance device 340 is a mixed-ionic-electronic-conduction device (MIEC). In some embodiments, the negative resistance device 340 includes at least one of the elements in a chalcogenide group. The method 500 includes determine whether the memory cell is in a read operation or not in step S501. In step S502, during the read operation in the memory cell, apply a read voltage greater than a predetermined threshold voltage of the negative resistance device for making the negative resistance device entering into a negative resistance state.

According to some embodiments, the disclosure provides a memory cell array. The memory cell array includes a plurality of memory cells, a plurality of word lines, a plurality of bit lines, and a plurality of common source lines. Each of the memory cells includes a switch, a memory element, and a negative resistance device. The switch includes a first terminal, a second terminal, and a control terminal. The first terminal of the switch is coupled to one of the common source lines and a control terminal of the switch is coupled to one of the word lines. The memory element includes a first terminal and a second terminal. The first terminal of the memory element is coupled to a second terminal of the switch. The negative resistance device includes a first terminal and a second terminal. The first terminal of the negative resistance device is coupled to a second terminal of the memory element, and a second terminal of the negative resistance device is coupled to one of the bit lines. The switch, the memory element, and the negative resistance device are coupled in series. During a read operation in the memory cell array, a read voltage greater than a predetermined threshold voltage of the negative resistance device is applied to the negative resistance device for making the negative resistance device entering into a negative resistance state.

According to some embodiments, the disclosure provides a memory device. The memory device includes a driver, a sense amplifier, a data output, and a memory cell array. The memory cell array includes a plurality of memory cells, a plurality of word lines, a plurality of bit lines, and a plurality of common source lines. Each of the memory cells includes a switch, a memory element, and a negative resistance device. The switch includes a first terminal, a second terminal, and a control terminal. The first terminal of the switch is coupled to one of the common source lines and a control terminal of the switch is coupled to one of the word lines. The memory element includes a first terminal and a second terminal. The first terminal of the memory element is coupled to a second terminal of the switch. The negative resistance device includes a first terminal and a second terminal. The first terminal of the negative resistance device is coupled to a second terminal of the memory element, and a second terminal of the negative resistance device is coupled to one of the bit lines. The switch, the memory element, and the negative resistance device are coupled in series. During a read operation in the memory cell array, a read voltage greater than a predetermined threshold voltage of the negative resistance device is applied to the negative resistance device for making the negative resistance device entering into a negative resistance state.

According to some embodiments, the disclosure provides a method to control a memory cell in a memory device, where the memory cell includes a switch, a memory element and a negative resistance device coupled in series, the method includes: determine whether the memory cell is in a read operation or not; during the read operation in the memory cell, apply a read voltage greater than a predetermined threshold voltage of the negative resistance device for making the negative resistance device entering into a negative resistance state.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A memory cell array, comprising:
    a plurality of memory cells,
    a plurality of word lines;
    a plurality of bit lines; and
    a plurality of common source lines,
    wherein each of the memory cells comprising:
        a switch, a first terminal of the switch is coupled to one of the common source lines and a control terminal of the switch is coupled to one of the word lines;
        a memory element, a first terminal of the memory element is coupled to a second terminal of the switch; and
        a negative resistance device, a first terminal of the negative resistance device is coupled to a second terminal of the memory element, and a second terminal of the negative resistance device is coupled to one of the bit lines,
    wherein the switch, the memory element, and the negative resistance device are coupled in series,
    wherein during a read operation in the memory cell array, a read voltage greater than a predetermined threshold voltage of the negative resistance device is applied to the negative resistance device for making the negative resistance device enter into a negative resistance state.

2. The memory cell array of claim 1, wherein the negative resistance device is an ovonic threshold switch (OTS).

3. The memory cell array of claim 1, wherein the switch is a CMOS transistor.

4. The memory cell array of claim 1, wherein the memory element is a magnetic tunnel junction (MTJ) device.

5. The memory cell array of claim 1, wherein the read voltage of is applied to the negative resistance device by a voltage difference between the one of the bit lines and one of the common source lines.

6. The memory cell array of claim 1, wherein a loading of each of the memory cells are reduced while the negative resistance device entering into the negative resistance state.

7. The memory cell array of claim 1, wherein the predetermined threshold voltage of the negative resistance device is adjusted with different materials.

8. The memory cell array of claim 7, wherein the negative resistance device is a metal-semiconductor-metal (MSM).

9. The memory cell array of claim 7, wherein the negative resistance device is a mixed-ionic-electronic-conduction device (MIEC).

10. The memory cell array of claim 7, wherein the negative resistance device comprises at least one of the elements in a Chalcogenide group.

11. The memory cell array of claim 1, wherein during a write operation in the memory cell array, a write voltage greater than the predetermined threshold voltage is applied to the negative resistance device for making the negative resistance device enter into a low resistance state.

12. A memory device, comprising:
    a driver configured to generate a read voltage and a write voltage to perform a read operation and a write operation in the memory device;
    a sense amplifier;
    a data output, configured to receive an input from the sense amplifier and generates an output;
    a memory cell array, wherein the memory cell array comprising:
        a plurality of memory cells,
        a plurality of word lines;
        a plurality of bit lines; and
        a plurality of common source lines,
        wherein each of the memory cells comprising:
            a switch, a first terminal of the switch is coupled to one of the common source lines and a control terminal of the switch is coupled to one of the word lines;
            a memory element, a first terminal of the memory element is coupled to a second terminal of the switch; and
            a negative resistance device, a first terminal of the negative resistance device is coupled to a second terminal of the memory element, and a second terminal of the negative resistance device is coupled to one of the bit lines, wherein the switch, the memory element, and the negative resistance device are coupled in series, a wherein during the read operation of the memory cells, the read voltage greater than a predetermined threshold voltage of the negative resistance device is applied to the negative resistance device for making the negative resistance device enter into a negative resistance state.

13. The memory device of claim 12, wherein the negative resistance device is an ovonic threshold switch (OTS).

14. The memory device of claim 12, wherein the memory element is a magnetic tunnel junction (MTJ) device.

15. The memory device of claim 12, wherein the read voltage of is applied to the negative resistance device by a voltage difference between the one of the bit lines and one of the common source lines.

16. The memory device of claim 12, wherein a loading of each of the memory cells are reduced while the negative resistance device is entering into the negative resistance state.

17. The memory device of claim 12, wherein during a write operation in the memory device, the write voltage greater than the predetermined threshold voltage is applied to the negative resistance device for making the negative resistance device enter into a low resistance state.

18. A method to control a memory cell in a memory device, wherein the memory cell includes a switch, a memory element and a negative resistance device coupled in series, wherein the switch includes a control terminal coupled to a control line, comprising:

determine whether the memory cell is in a read operation or not;

a during the read operation of the memory cell, apply a read voltage greater than a predetermined threshold voltage of the negative resistance device to the negative resistance device for making the negative resistance device enter into a negative resistance state.

19. The method of claim 18, wherein the read voltage of is applied to the negative resistance device by a voltage difference between a bit line and a common source line.

20. The method of claim 18, further comprising:

determine whether the memory cell is in a write operation or not;

wherein during the write operation, apply the write voltage greater than the predetermined threshold voltage for making the negative resistance device enter into a low resistance state.

* * * * *